(12) United States Patent
Houston et al.

(10) Patent No.: US 7,907,456 B2
(45) Date of Patent: Mar. 15, 2011

(54) MEMORY HAVING CIRCUITRY CONTROLLING THE VOLTAGE DIFFERENTIAL BETWEEN THE WORD LINE AND ARRAY SUPPLY VOLTAGE

(75) Inventors: Theodore W. Houston, Richardson, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 261 days.

(21) Appl. No.: 11/931,098

(22) Filed: Oct. 31, 2007

(65) Prior Publication Data

US 2009/0109785 A1 Apr. 30, 2009

(51) Int. Cl.
*G11C 5/14* (2006.01)
*G11C 11/00* (2006.01)

(52) U.S. Cl. .................... 365/189.09; 365/154; 365/227

(58) Field of Classification Search .................. 365/154, 365/189.09
See application file for complete search history.

(56) References Cited

U.S. PATENT DOCUMENTS

| | | | | |
|---|---|---|---|---|
| 5,452,246 A | * | 9/1995 | Kawashima | 365/154 |
| 5,642,315 A | * | 6/1997 | Yamaguchi | 365/189.09 |
| 5,748,532 A | * | 5/1998 | Tanaka et al. | 365/185.18 |
| 5,872,734 A | * | 2/1999 | Tanaka et al. | 365/185.24 |
| 6,222,780 B1 | * | 4/2001 | Takahashi | 365/189.09 |
| 6,611,451 B1 | * | 8/2003 | Houston | 365/154 |
| 6,765,832 B1 | * | 7/2004 | Ohtani | 365/200 |
| 7,269,075 B2 | | 9/2007 | Demone | |
| 7,283,417 B2 | | 10/2007 | Davis et al. | |
| 7,480,192 B1 | * | 1/2009 | Nguyen | 365/189.11 |
| 7,626,852 B2 | * | 12/2009 | Houston | 365/154 |
| 2005/0207228 A1 | * | 9/2005 | Yamashita et al. | 365/185.22 |
| 2005/0219921 A1 | * | 10/2005 | Yamauchi | 365/200 |
| 2005/0237848 A1 | * | 10/2005 | Takahashi et al. | 365/232 |
| 2007/0025162 A1 | | 2/2007 | Deng et al. | |
| 2007/0025169 A1 | | 2/2007 | Houston | |
| 2008/0056031 A1 | * | 3/2008 | Takahashi et al. | 365/194 |

\* cited by examiner

*Primary Examiner* — Ly D Pham
(74) *Attorney, Agent, or Firm* — Rose Alyssa Keagy; Wade J. Brady, III; Frederick J. Telecky, Jr.

(57) ABSTRACT

An integrated circuit (IC) includes at least one memory array having a plurality of memory cells arranged in a plurality of rows and columns, the array also having a plurality of word lines for accessing rows of cells and a plurality bit lines for accessing columns of cells. A voltage differential generating circuit is operable to provide a differential wordline voltage (VWL) relative to an array supply voltage, wherein the differential is a function of the array supply voltage.

25 Claims, 8 Drawing Sheets

MEMORY HAVING CIRCUITRY CONTROLLING THE VOLTAGE DIFFERENTIAL BETWEEN THE WORD LINE AND ARRAY SUPPLY VOLTAGE

FIELD OF INVENTION

The present invention relates generally to semiconductor memory devices and more particularly integrated circuits having memory devices which include SRAM or other memory cells that use voltage differentials to improve device performance.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or nonvolatile read only memories (ROMs), where RAMs can either be static (e.g. SRAM) or dynamic (e.g. DRAM), differing mainly in the manner by which they store a state of a bit. Several types of DRAM memory cells are used commonly, including a single capacitor memory cell (1T1C) and a dual capacitor memory cell (2T2C). As illustrated in FIG. 1A, conventional 1T1C DRAM cell 105 includes one access transistor 108 and one memory storage capacitor 110. A storage node capacitor plate (storage plate) 112 of the storage capacitor 110 is connected to a source terminal (source node) 114 of the transistor 108. The 1T1C cell 105 is read from, or written into by applying a signal via the word line WL 115 to the gate 116 of the transistor, thereby coupling the storage plate 112 of the capacitor 110 to the drain 117 of the transistor and the bit line BL 118. A ground node (ground plate) 120 of the storage capacitor 110 is connected to a common ground of the memory array. A sense amplifier (not shown) is connected to the bitline 118 and detects the voltage associated with a logic value of either 1 or 0 associated with the charge of the DRAM capacitor 110. In this manner, the memory cell data is retrieved.

Ferroelectric RAM (FeRAM or FRAM) is a type of non-volatile memory that uses a ferroelectric layer to achieve non-volatility. As shown in FIG. 1B, conventional FeRAM storage cell 10 is activated through the word-line (WL) 12, and written or read through the bit-line (BL) 14 and plate-line (PL) 16. As illustrated, the storage cell 10 includes a storage capacitor that can store a ferroelectric capacitance (CFE), to define a voltage differential Vc.

Magnetic random access memory (MRAM) is a type of non-volatile memory. FIG. 1C shows a schematic diagram of a portion 30 of a conventional MRAM array, which includes a plurality of memory cells 52-59. Each memory cell 52-59 includes a magnetoresistive (MR) element 20 27 and a transistor 30 37. The transistors 30 33 are coupled to each other via a word line (WL1) 40, and transistors 34 37 are coupled to each other via a word line (WL2) 41, where the word lines 40, 41 form the gate electrode for the transistors 30 37. The transistors 30 33 are also coupled to each other via a program line (PL1) 42, and transistors 34 37 are coupled via a program line (PL2) 43, where the program lines 42, 43 serve as virtual ground lines. Similarly, the MR elements 20 and 24 are coupled to each other by bit line (BL1) 45, MR elements 21 and 25 are coupled to each other by bit line (BL2) 46, MR elements 22 and 26 are coupled to each other by bit line (BL3) 47, and MR elements 23 and 27 are coupled to each other by bit line (BL4) 48.

The basic CMOS SRAM cell generally includes two n-type or n-channel (NMOS) pull-down or drive transistors and two p-type (PMOS) pull-up or load transistors in a cross-coupled inverter configuration, with two additional NMOS select or pass-gate transistors added to make up a standard double-sided or differential six-transistor memory cell (a DS 6T SRAM cell, a 6T SRAM cell, or simply a 6T cell). 8 transistor, 9 transistor, 5 transistor and 4 transistor SRAM cells are also known. Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

FIG. 1D is schematic of a conventional differential SRAM 6T cell 130. As illustrated, the SRAM cell 130 comprises a data storage cell or latch 132, generally including a pair of cross-coupled inverters, for example, inverter 142, and inverter 144, the latch 132 operable to store a data bit state. FIG. 1D illustrates that the bit is stored in the latch 132 at the data nodes or first and second latch nodes 134 and 136, respectively, having a high or "1" state and a low or "0" state, respectively. Cell 130 of FIG. 1D also comprises a pair of wordline pass transistors 146, 148 to read and write the data bit between the cross-coupled inverters 142, 144 and bitlines BL 160, BL-bar 162, when enabled by wordline 164.

Respective inverters 142, 144 comprise a p-type MOS (PMOS) pull-up or load transistor Q1 150, Q2 152 and an n-type (NMOS) pull-down transistor Q3 154, Q4 156. Pass gates (e.g., transistors) Q5 146, Q6 148 are n-channel as well, which generally supply higher conductance as compared to p-channel transistors. Pass transistors 146, 148 are enabled by wordline 164 and accessed by bitlines 160, 162 to set or reset the SRAM latch 130. FIG. 1D further illustrates that inverters 142, 144 of the SRAM memory cell 130 are connected together to a Vdd drain power supply line 170 and a Vss source power supply line 180. Both Vdd drain power supply line 170 and a Vss source power supply line 180 are generally provide at fixed voltage levels, such as 1.2 Volts and 0 Volts, respectively.

In general, SRAM cells are more stable and have better data retention where the respective pMOS (150, 152) and nMOS (154, 156) transistors are balanced and matched within the two inverters (142, 144). However, as dimensions are reduced to scale down devices, it becomes increasingly difficult to achieve a balance in the relative strengths of the pass gate, drive, and load transistors over the desired range of temperature, bias conditions, and process variations, as well as achieving matched transistor characteristics. As a result, SRAM cells formed as such can be adversely affected by varying operating characteristics and may be unstable and may not retain the desired bit state, during read or write operations.

During conventional read or write operations, bitlines 160 and 162 are initially precharged to a high or "1" state as illustrated. A read voltage is asserted to wordline WL 164 during a read or a write operation to activate (turn-on) pass transistors Q5 146 and Q6 148 into conduction, whereby latch 132 may be accessed by bitlines 160 and 162, respectively. With the prior data states as shown in FIG. 1D, an exemplary high state "1" is on a first latch node 134 at the gate of Q4 156, and a low state "0" is on a second latch node 136 at the gate of Q3 154. With these data states, only Q4 156 on the "low side" conducts via latch node 136, and pulls bitline-bar 162 lower, while Q3 154 on the "high side" does not conduct and thus, leaves bitline 160 high. Thus, given a finite amount of time, the cell will increasingly establish a greater differential voltage between the bitlines 160 and 162.

The intrinsic stability of a conventional SRAM cell is known to correspond to a noise-margin of a cross-coupled inverter loop of the cell when it is disconnected from the bit-lines, referred to commonly as the static noise margin (SNM). In contrast, the read stability of the cell corresponds to the noise-margin of the inverter loop with the word-line being active and the cell internal nodes being connected to the bit-lines. The read stability is usually worse than the intrinsic stability. As a result, the power supply can drop to a far lower value than when the cell is read-out. $V_{min}$ refers to the lowest power supply voltage at which an SRAM array still functions properly.

With scaling, it is increasingly difficult to design and operate an SRAM cell to be both stable and to be writeable across process variation, such as threshold variation, and across supply voltage variation. Supply voltage variation is often associated with use of a battery as the power supply source for the SRAM. Concurrently maintaining adequate read current (Iread) is also a problem.

For minimizing SRAM and other memory power consumption, as with other non-memory circuits, it is generally desirable for the total power supply voltage to be as low as possible. In the conventional case Vss is held at ground, Vdd needs to be minimized. Vdd for the array is generally referred to as VDDM. It is noted that VDDM is only set by the user within certain limits, since for most applications VDDM changes over time, such as a function of battery charge level as well as other factors that are known to affect VDDM. A low VDDM is known to degrade writeability and Iread. As noted above, process variation which can be significant even across a given die, can also be a factor in determining stability, writeability (Vtrip) and read current. What is needed is a memory circuit that is capable of compensating for process variation, such as threshold variation, in the case of SRAM and across supply voltage variation to relax the SNM/Vtrip/read current tradeoff to allow further scaling of SRAM cells.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit (IC) includes at least one memory array having a plurality of memory cells arranged in a plurality of rows and columns, the array also having a plurality of word lines for accessing rows of cells and a plurality bit lines for accessing columns of cells. The memory array can comprise SRAM, or other memory such as MRAM or FeRAM, or a DRAM that uses VDDM that may be developed.

A voltage differential generating circuit is operable to provide a differential wordline voltage (VWL) relative to an array supply voltage, wherein the differential is a function of the array supply voltage. Through control of the voltage differential between the supply voltage, such as the high supply for the array (VDDM) and VWL, in the case of SRAMs, it has been found by the present inventors that the memory becomes more stable and writable across process variation and across supply voltage variation, and adequate read current generally becomes easier to maintain.

In one embodiment the differential is also a function of a process related device parameter or a temperature during operation of the IC. Process related device parameter can be selected from Vtn, Vtp, gm, Idsat, and Idlin.

In one embodiment the supply voltage comprises a high supply for the array (VDDM). In another embodiment, the IC further comprises trend selection storage circuitry on the IC coupled to the voltage differential generating circuitry operable to select a trend which relates VWL as a function of the array supply voltage from a plurality of different trends. The storage circuitry can be programmable.

The IC can further comprise trend selection circuitry coupled to the voltage differential generating circuitry. In one embodiment, the trend selection circuitry consists of a single global trend selection circuit. In another embodiment, the trend selection circuitry comprises a plurality of local trend selection circuits.

In one embodiment, the voltage differential generating circuitry consists of a single global voltage differential generating circuit. In another embodiment, the voltage differential generating circuitry comprises a plurality of independent local voltage differential generating circuits. The plurality of local voltage differential circuits can include a MOS strength or a parameter related thereto as an input. The plurality of local voltage differential generating circuits can include an op-amp or other differential input amplifier, wherein a gain of the amplifier is determined by the MOS strength parameter or a parameter related thereto.

In one embodiment the voltage differential generating circuitry is operable to set VWL=VDDM for VDDM less than a voltage level and VWL<VDDM for VDDM above the voltage level. The VWL level can be clamped at a level above the voltage level.

An integrated circuit (IC) comprises at least one memory array comprising a plurality of SRAM memory cells arranged in a plurality of rows and columns, the array also having a plurality of word lines for accessing rows of cells and a plurality bit lines for accessing columns of cells. The memory cells each including first and second cross-coupled inverters comprising PMOS loads and NMOS pull up devices, the first inverter having a first latch node and the second inverter having a second latch node; and one or more NMOS pass transistor coupled to the first latch node and to the second latch node, one of the word lines being connected to a gate of the pass transistor and one of the bit lines being connected to a source or drain of the pass transistor. A low supply voltage for the array (VSSM) is coupled to a low voltage supply terminal of the cross-coupled inverters, and a high voltage supply for the array (VDDM) coupled to a high voltage supply terminal of the cross-coupled inverters. At least one voltage differential determining circuit operable for dynamically controlling a voltage differential between VDDM and a word line voltage (VWL) coupled to the plurality of word lines, wherein the voltage differential is based on VDDM and at least one process related parameter associated with the array. The at least one voltage differential determining circuit can comprise a plurality of voltage differential determining circuits.

A method of operating an integrated circuit comprising at least one memory array, the memory array comprising a plurality of memory cells arranged in a plurality of rows and columns, the array also having a plurality of word lines for accessing rows of cells and a plurality bit lines for accessing columns of cells is provided. The method comprises the step of automatically setting a voltage differential between a supply voltage for the array and a word line voltage (VWL) coupled to the plurality of word lines based on at least the supply voltage.

The method can comprise the step of selecting a trend from of a plurality trends which relate VWL as a function of the array supply voltage, wherein VWL is based on the trend selected and the supply voltage. The selecting can comprise programmable selection. The selecting can comprise on-chip selecting.

In one embodiment the selecting consists of a single global selection for the IC. In another embodiment, the selecting comprises a plurality of localized selecting. The setting step can comprise dynamically setting, wherein the voltage differential is automatically updated during operation of the IC. In one embodiment, the voltage differential can comprises VWL=VDDM for VDDM less than a voltage level and VWL<VDDM for VDDM greater than the voltage level. In this embodiment, VWL can be clamped at a level above the voltage level. In another embodiment, VWL>VDDM for VDDM less than a voltage level and VWL<VDDM for VDDM greater than the voltage level.

DETAILED DESCRIPTION

Figure 1A:
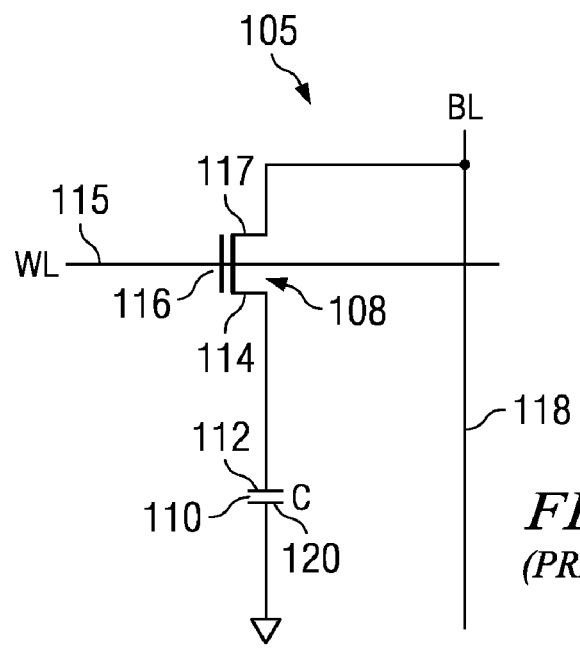
FIG. 1A is a partial schematic diagram illustrating a conventional 1T1C DRAM cell, comprising one transistor and one capacitor.
Figure 1B:
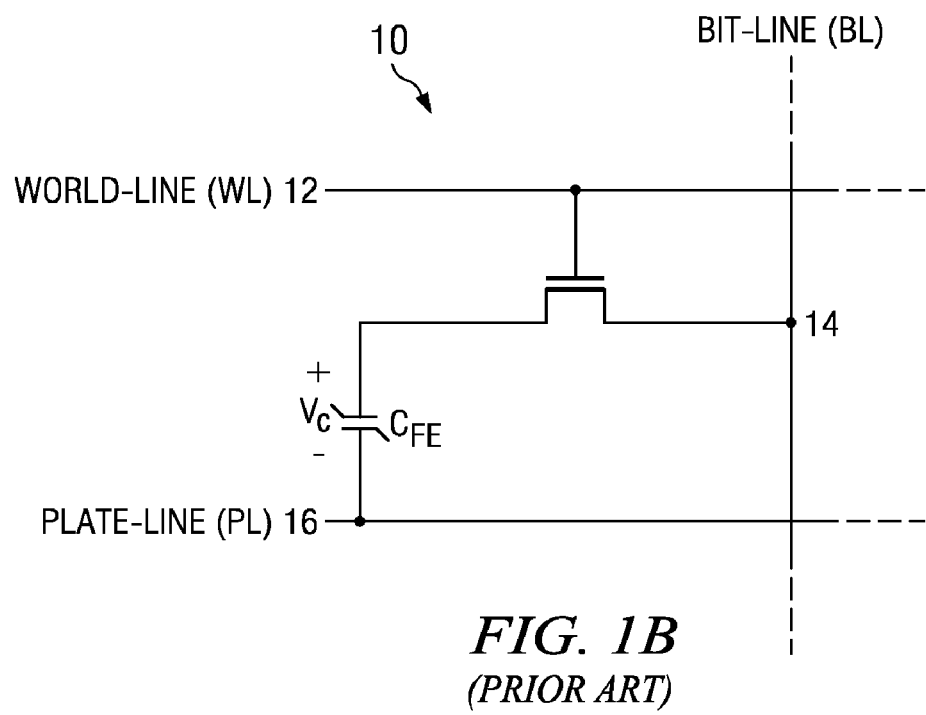
FIG. 1B is a schematic diagram illustrating a conventional FeRAM storage cell.
Figure 1C:
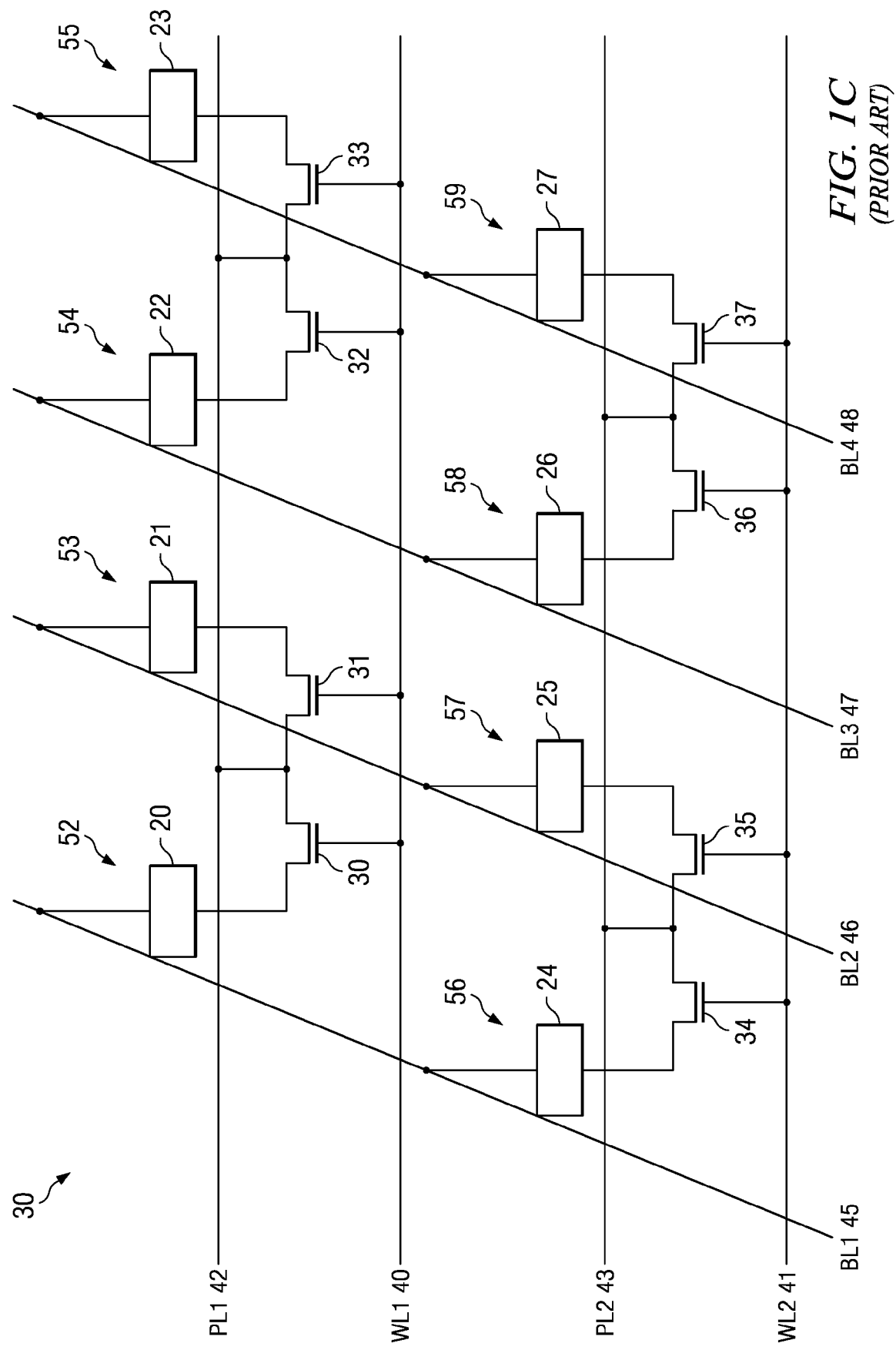
FIG. 1C is a schematic diagram of a portion of a conventional MRAM array.

The present invention will now be described with reference to the attached drawings, wherein like reference numerals are used to refer to like elements throughout. The present invention is a new integrated circuit (IC) design comprising an SRAM or other memory (e.g. FeRAM or MRAM) and related method that can compensate the SRAM or other memory for process variation, such as threshold variation and/or supply voltage variation and/or drift over time and/or temperature. The present invention uses a differential between the WL high voltage (VWL) and the array supply voltage, such as the array high voltage VDD (VDDM), for compensation of one or more of such variations to improve the SNM/Vtrip/read current tradeoff which in one embodiment supports current SRAM designs and permits further scaling of SRAM cells. Although generally described below relative to SRAMs, the present invention is also applicable to other memories including FeRAM or MRAM. The differential can be in one embodiment programmable, and in another embodiment dynamically programmable.

Figure 1D:
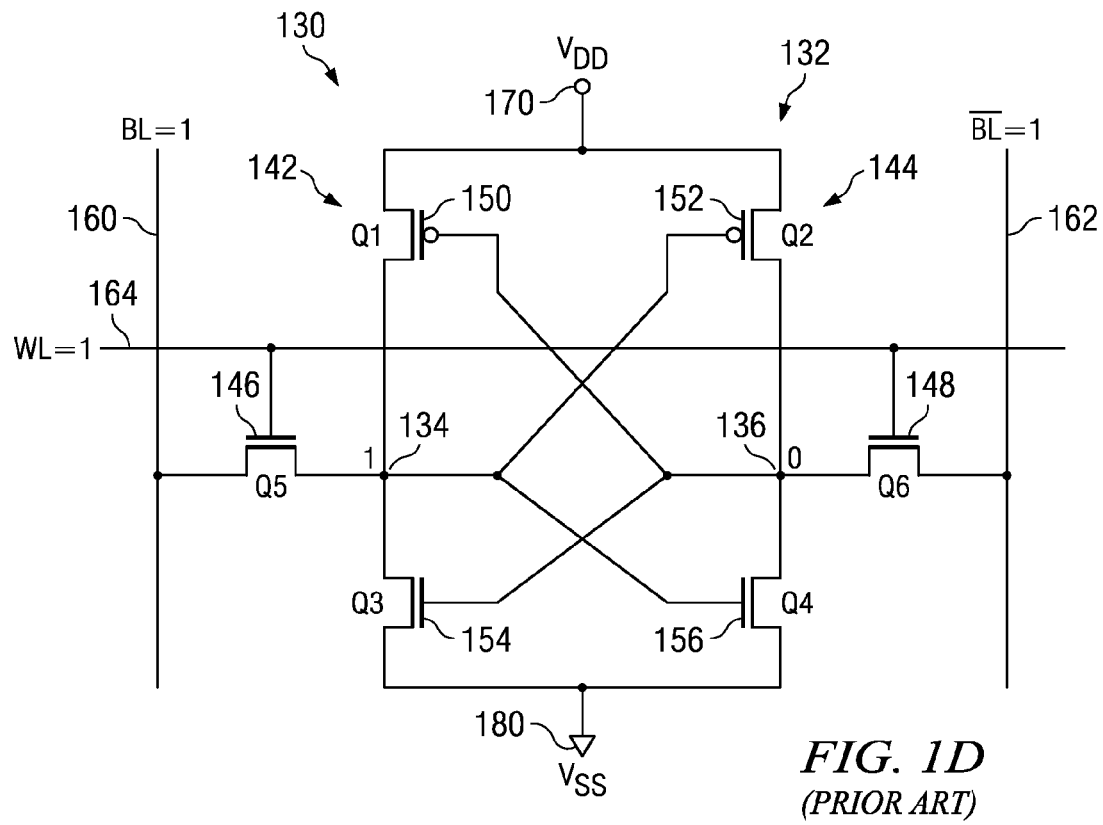
FIG. 1D is a schematic diagram of a conventional differential 6T static random access memory (SRAM) cell.

It has been found that a relatively higher VWL generally decreases stability and increases writeability, while a relatively lower VWL does the opposite. Raising or lowering VWL relative to VDDM is used by the present invention to compensate for process and power supply variation, and can be used to compensate for other factors such as temperature and age related drift. Generally, applied to SRAMs, for cells having NMOS pass and pull-down devices and PMOS loads, such as for the 6T cell shown in FIG. 1D, a low Vtn/high Vtp (high Vtp meaning a more negative threshold) is generally bad for stability and good for writeability and vice-versa. Another performance impacting variable is VDDM. A low VDDM degrades writablity and Iread but may have a weak or opposite effect on stability. In one embodiment, the present invention provides a relatively higher VWL when VDDM is low to improve the worst case Iread and writeability as allowed by stability.

The IC may have multiple instance of separate memory, such as multiple SRAMs or other memories. The present invention can include the differential being generated globally (i.e. once for the IC) or locally at each SRAM instance, or some combination of local and global. The differential may have different "tracks" or "trends" which define a relation between VWL and the array supply voltage (e.g. VDDM) that can be selected either centrally (see FIG. 2B described below) or locally (see FIG. 2C described below). If so, the selection of a particular trend from a plurality of trends can be made based on information supplied from off-chip (e.g. probe data; see FIG. 2B described below) and/or from on-chip circuits/sensors. Alternatively, the circuit generating the differential can adjust the differential, thus not requiring a trend selection (see FIG. 2E described below). Another embodiment comprises varying the differential across a single SRAM instance (see FIG. 2F described below).

Figure 2A:
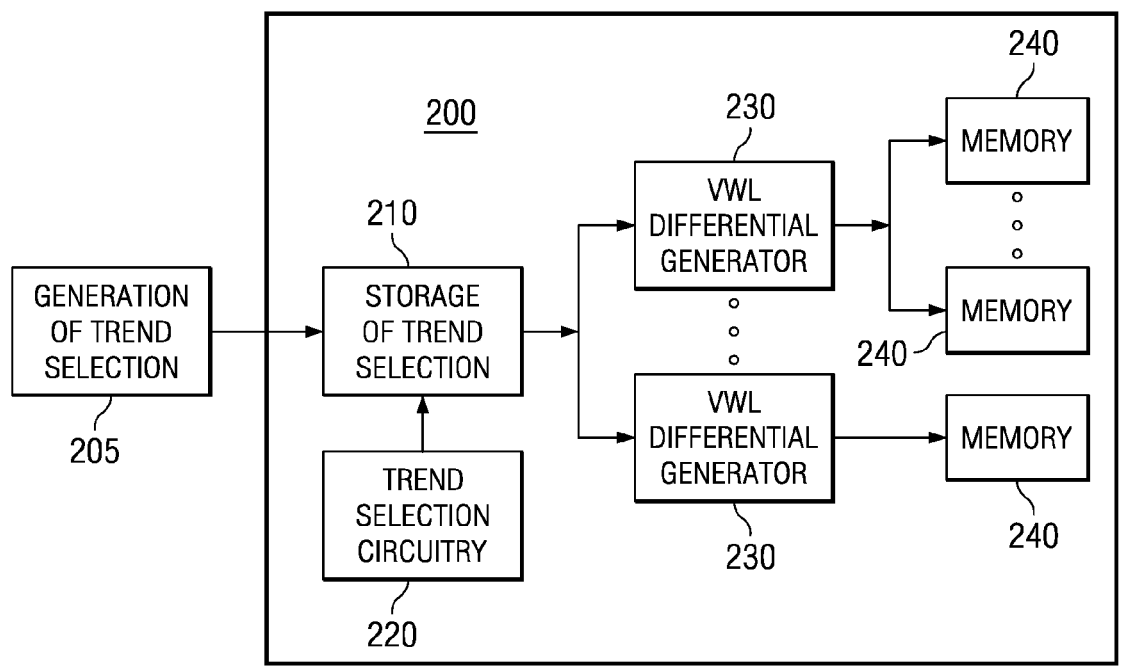
FIG. 2A-G are block diagram schematics of several exemplary embodiments of integrated circuits according to the invention comprising one or more memory instances implementing a VWL to supply voltage differential on the memory.

FIG. 2A shows an IC 200 according to an embodiment of the invention comprising a plurality of memory instance 240. IC 200 also includes off-chip generation of trend selection 205. IC 200 includes on-chip storage for data relating to trend selection 210 received from generation of trend selection 205 and/or on-chip trend selection circuitry 220. Trend selection storage circuitry 210 can comprise, for example, a ROM, fuse bank, or register file. For storage 210 having n binary bits, for example, any one of $2^n$ trends can be selected. A plurality of local VWL differential generators 230 which implement the VWL to supply voltage differential for memory 240 have an input that is coupled to the output of storage of trend selection 210.

Figure 2B:
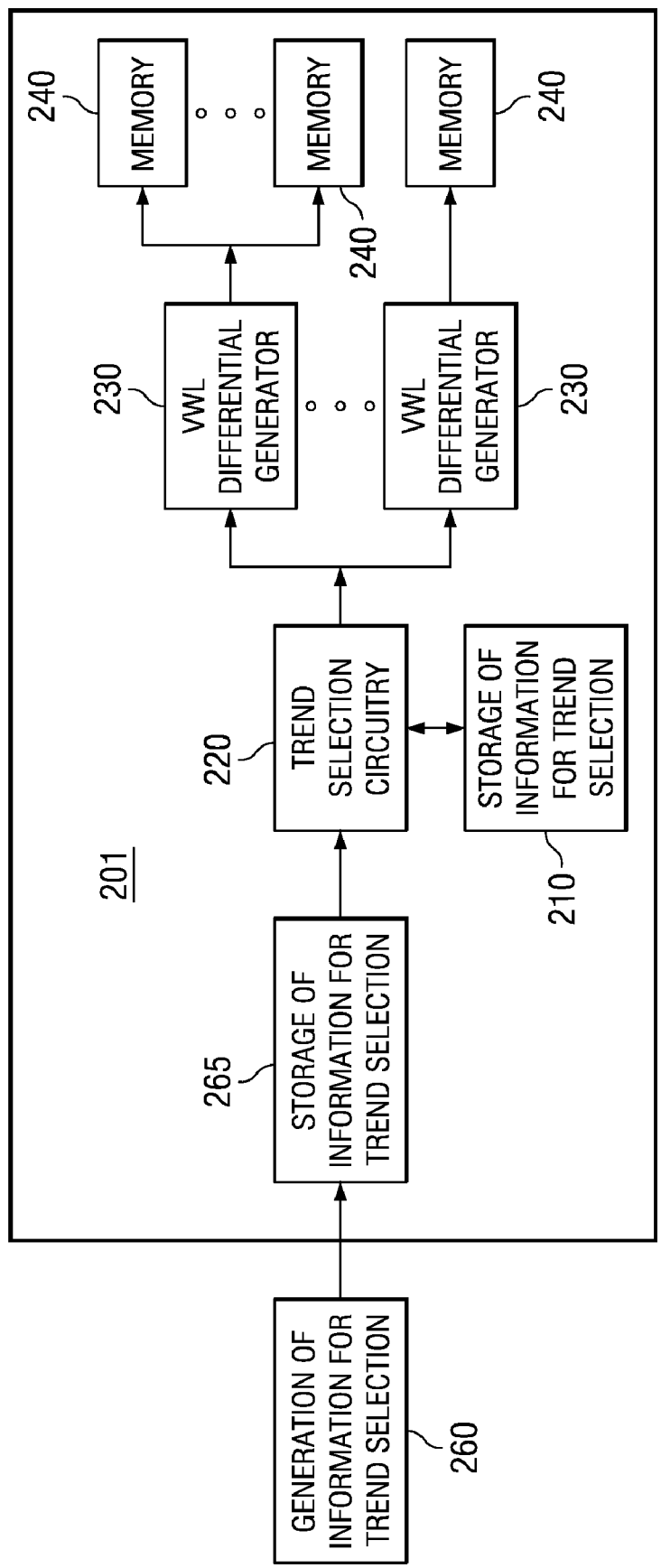

FIG. 2B shows an IC 201 according to an embodiment of the invention comprising a plurality of memory instance 240. Off-chip generation of information for trend selection 260, which can comprises wafer probe or final test data, is also shown in FIG. 2B. The information for trend selection from generation of information for trend selection 260 is shown stored on-chip in storage of information for trend selection 265. Other information for trend selection is shown stored on-chip in storage of other information for trend selection 210, that may be used if specific local trend information is generated on-chip. Any stored information could be in a common storage area, or may be separated as shown in FIG. 2B.

Centralized trend selection circuit 220 receives information for trend selection from storage 265 is coupled to a plurality of local VWL differential generators 230, which are in turn coupled to one or more memory instance 240.

Figure 2C:
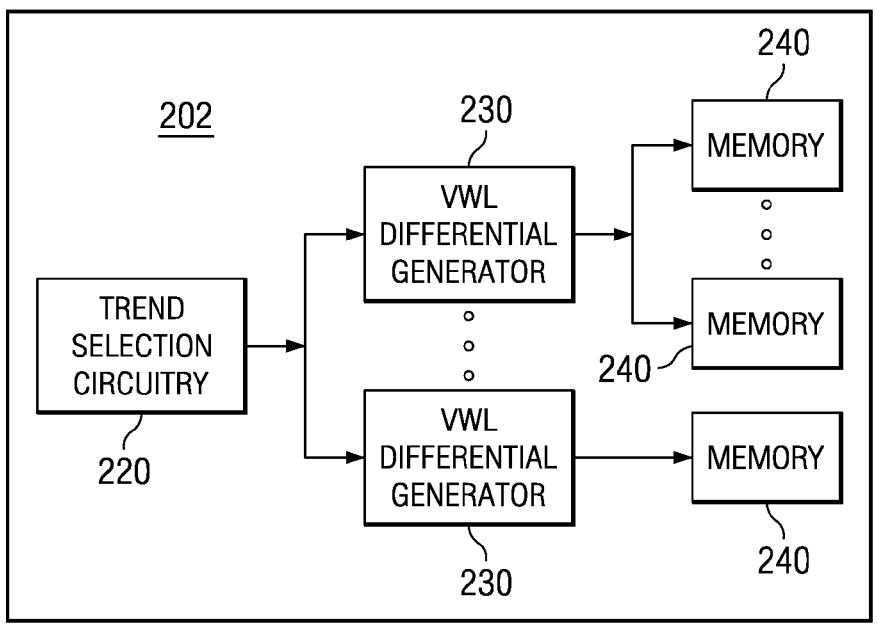

FIG. 2C shows an IC 202 according to an embodiment of the invention comprising a plurality of memory instance 240. Unlike IC 200 and 201, IC 202 does not receive any off-chip derived information. IC 202 includes a plurality of trend selection circuits 220 which allows the plurality of local VWL differential generators 230 which are coupled to one or more memory instance 240 to implement different trends for each memory instance 240.

Figure 2D:
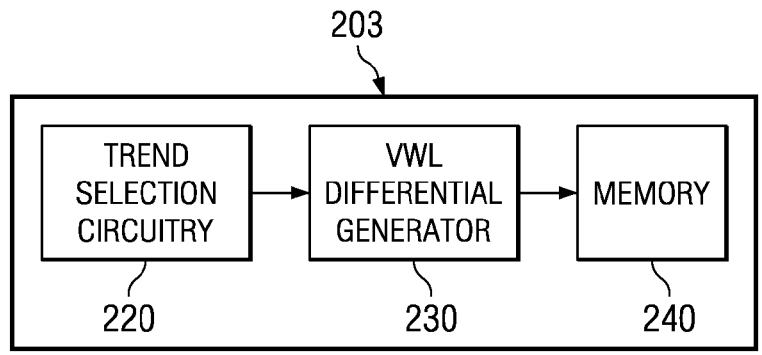

FIG. 2D shows an IC 203 according to an embodiment of the invention comprising a single trend selection circuits 220, a single central VWL differential generator 230, and a single memory instance 240. Like IC 2002, IC 203 does not receive any off-chip derived information.

Figure 2E:
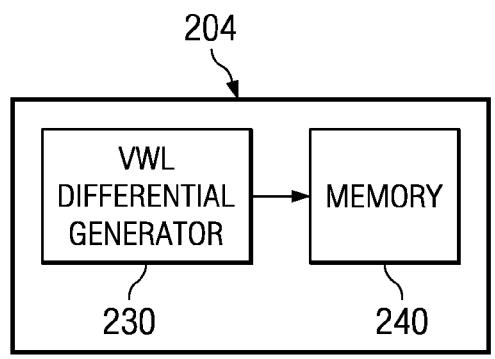

FIG. 2E shows an IC 204 according to an embodiment of the invention which is operable without trend selection. In this embodiment, the central VWL differential generator 230 includes circuitry which independently adjusts the VWL differential for memory 240, such as in response to Vtn. IC 204 does not receive any off-chip derived information.

Figure 2F:
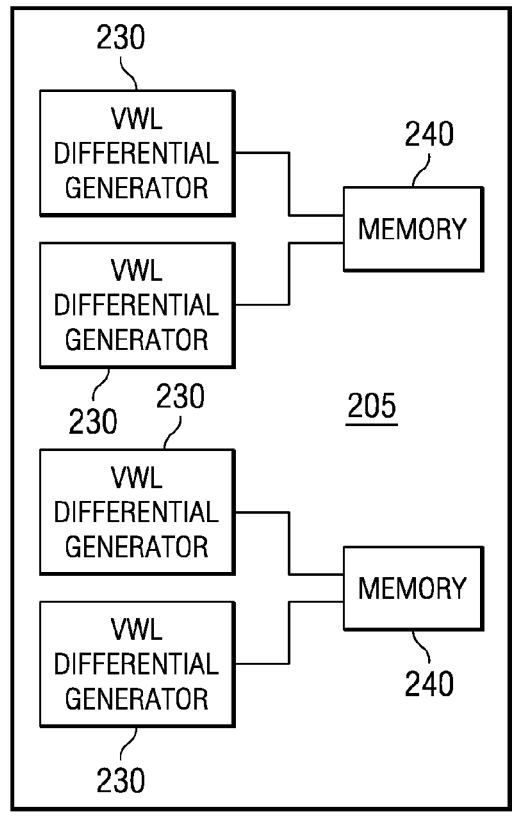

FIG. 2F shows an IC 205 according to an embodiment of the invention comprising a plurality of VWL differential generators 230 and a plurality of memory instance 240. More than one VWL differential generator 230 is shown coupled to each memory instance 240.

Figure 2G:
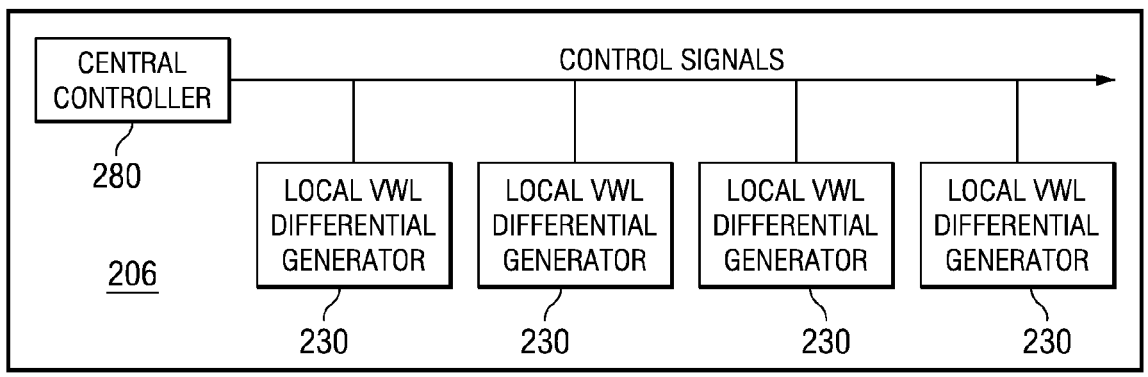

In another embodiment of the invention, a central selection control circuit provides trend selection data, such as in the form of binary control signals, to a plurality of local differential generating circuits. FIG. 2G shows an IC 206 according to an embodiment of the invention showing a central controller 280, which in one embodiment is a fuse bank. Another embodiment of central controller 280 comprises a sense circuit; e.g. a temperature sensor or a circuit that gives some measurement of Vtn and/or Vtp, or some more direct indicator of SRAM cell SNM and/or Vtrip. Central controller 280 generates VDDM/VWL differential control signals which are coupled to a plurality of localized differential generating circuits 230 on the memory chip which receive control signals from central controller 280 and generate the VDDM/VWL differential.

To implement IC 206, in one embodiment, at least one component strength parameter generally determined during wafer probe or final (package) test, is generally obtained. Component strength parameters can be threshold voltage (Vtn or Vtp), transconductance (gm for nMOS or pMOS), Idsat, Idlin (for NMOS or PMOS), for example. In another embodiment, at least one measurement of an SRAM cell characteristic (e.g. Vtrip) is obtained. As described above, in one embodiment of the present invention, central controller 280 comprises a fuse ROM. The fuse ROM can be set at wafer probe to provide a binary (e.g. 3 bits) or analog (current or voltage) control signal to indicate which of a plurality of VWL voltage trends will be followed, such as one of the two trends shown in FIG. 4 (described below), which shows local control either following a first trend which tracks VDDM with limiting, such as beginning at 1.2v, or a second trend which follows a lower voltage trend line. In the case of digital control signals, local differential generators 295 can optionally store the received control signal. For n binary bits, one of up to $2^n$ VWL trends can be selected.

Thus, IC 206 sets the WL/VDDM differential locally, but with central controller 280. As noted above, it has been found that an optimized VWL/VDDM differential provides a strong knob on memory with reduced area/power overhead. The distribution of binary signals or distribution of an analog signal (e.g. reference voltage) from controller 280 to high impedance inputs (such as to an inverter or to a follower) relaxes routing requirements compared to distributing a supply voltage from a centralized controller.

As shown above, the differential can thus be applied globally across one or more memory instance, centrally determined but generated locally, or determined and generated locally in a plurality of portions for each memory instance. The local embodiment generally permits further efficiency by better customizing the VDDM/VWL differential to local conditions in the memory. The differential in any of these embodiments can be dynamically modifiable. It is noted that during certain periods of time or under certain conditions, the VDDM/VWL differential can be zero or essentially zero (e.g. <0.01 volts).

In a typical embodiment of the invention, VWL is derived from VDDM with VWL being $\leq$ VDDM. However, in another embodiment, VWL is derived from a voltage>VDDM, such as when an I/O supply is also available, for example an I/O supply of 1.8 volts Alternatively, VWL>VDDM can be derived from VDDM, e.g. with a charge pump. Whether VWL is >VDDM, VWL=VDDM, or VWL<VDDM, VWL can be derived from VDDM, from a supply from which VDDM is derived, or from a supply independent of VDDM. Thus, VWL can be controlled to be greater or less than VDDM. VWL>VDDM is desirable when the parameters are such that SNM is robust (stable cell) and Vtrip inadequate (difficult to write) or the Iread is inadequate. Typically, this condition is present when Vtn is high and/or |Vtp| is low, and/or VDDM is low. In yet another embodiment, VDDM is derived from VWL, such as when VWL is set by a band gap reference (providing an output voltage around 1.25 V), and VDDM is $\leq$ VWL.

In one embodiment of the present invention, a programmable differential between VDDM and VWL is provided. Taking the differential to be VDDM−VWL, for SRAMs having NMOS pass and pull-down devices and PMOS loads, the differential is generally larger (less negative or more positive) when one or more of:

(i) VDDM is higher (e.g. above some predetermined threshold), (ii) Vtn is low (e.g. below some predetermined threshold voltage) and (iii) Vtn/Vtp (in absolute value ratio) is low.

Vtn is generally a more sensitive parameter as compared to Vtp for use in the invention for SRAMs which have nMOS pass gates and pull-down devices and only pMOS loads, such as conventional 6T SRAMs. However, in other SRAM arrangements, Vtp can be a more important parameter as compared to Vtn and the relationship of the desired differential to the threshold voltages may be different.

Statistical simulations can be performed to predict the stability and write-ability margins as a function of the local transistor variability, the global transistor parameters about which the local variation occurs, VDDM, VWL, and the bit line voltage (VBL). Based on such simulations, a differential between VDDM and VWL can be identified that can optimize the margins as a function of the magnitude of the local variation, and the values of the global parameters, VDDM, and VBL. Generally, it is found that the margins are optimized by having a relatively lower VWL for higher VDDM. Moreover, it is also generally found that margins are optimized with a more negative differential (VWL<VDDM) for lower Vtn or for a lower ratio of Vtn to magnitude of Vtp. Thus, it may be desirable to select a different differential as a function of VDDM for different global parameters. As described above, off-chip equipment or on-chip circuits and sensors can be used to characterize the global parameters. Once the relation of the differential to VDDM for optimum margin is determined, a differential generating circuit is designed that will provide a trend that is essentially optimized within the restrictions of size, performance, and power.

In one embodiment, the selection of the differential between VDDM and VWL is relative to the value of a process dependent variable such as Vtn, and can be fixed by fuse, such as storage of trend selection circuit 210 shown in FIG. 2A embodied as a fusable PROM. In the well known current fuse method, a PROM fuse (made of polysilicon, for example) is melted (thereby "blowing" the fuse) by Joule heating generated by current flow. This programming may be performed at wafer probe, but can also be performed at final test. In the laser fuse method, a PROM fuse (made of polysilicon, for example) is melted at wafer probe by spot irradiation with a laser beam. In this method, a laser-blown type fuse ROM is used.

The VDDM/VWL differential can also be selected dynamically to permit periodic or continual updating (with a circuit responsive to a given variable, such as Vtn, VDDM, or the temperature (T). If the differential is dynamic, the circuit can respond by changing the VDDM/VWL differential responsive to parameter variations including temperature (T) and changes in various cell performance impacting device characteristics that can occur over product lifetime (e.g. threshold shift). In this case, fuse-based programming is not generally used. Dynamic programming arrangements can include, for example, defining an initial VDDM/VWL differential at start-up or another time during operation by doing an internal self test and then dynamically updating the VDDM/VWL differential at a plurality of later times during circuit operation based on the condition or performance of one or more cell components (e.g. Vtn), the performance of the array, or based on external factors such as temperature. Alternatively, the circuit setting the differential, such as VWL differential generator 230 shown in FIGS. 2A-G can have a response that is dependent on parameter(s) associated with the cell response, e.g. Vtn, in which case the differential is continuously adjusted in response to changes in that parameter(s). Dynamic adjustment can be implemented in conjunction with a programmable setting.

In one embodiment of the invention a memory array according to the present invention comprises a plurality of SRAM memory cells arranged in a plurality of rows and columns, the array also having a plurality of word lines for accessing rows of cells and a plurality bit lines for accessing columns of cells. The memory cells each include first and second cross-coupled inverters, the first inverter having a first latch node and the second inverter having a second latch node; and one or more pass transistor coupled to the first latch node and to the second latch node, one of the word lines being connected to a gate of the pass transistor and one of the bit lines being connected to a source or drain of the pass transistor. The array generally includes at least one controller for driving the plurality of word lines to a word line voltage (VWL) and for driving the plurality of bit lines to a bit line voltage (VBL). A low supply voltage for the array (VSSM) is coupled to a low voltage supply terminal of the cross-coupled inverters, and a high voltage supply for the array (VDDM) is coupled to a high voltage supply terminal of the cross-coupled inverters. In another embodiment, the memory array comprises a 5T SRAM memory cell. The array includes at least one voltage differential generating circuit according to the present invention operable for setting a relationship between VDDM and VWL based on VDDM compared to some reference or the differential can be compared to Vtn. Thus, in one embodiment, the voltage differential generating circuit may be programmable.

Particularly when across chip parametric variability is small, a centralized controller arrangement, such as shown for IC 202 in FIG. 2C can be used to select the trend for the VDDM/VWL differential, such as for multiple SRAM instances on a chip. This embodiment can have the disadvantage of a significant supply voltage IR drop from the centralized controller to relatively distant the memory array portions. In one embodiment, the centralized controller is based on a precision bandgap circuit.

Since small variations in VWL relative to VDDM (e.g. on the order of 10s of mv) have been found to generally have a large impact on SRAM performance, it is desirable to have the differential generated local to the memory array cells, so as to avoid voltage offsets due to distribution from a central controller, e.g. IR drops. With multiple arrays, such as a 4 M SRAM having 4×1 M arrays on a single chip, multiple circuits on the chip can be used to locally determine and locally set the VWL/VDDM differential. In this embodiment, there is motivation to have the differential circuit small in area and low in power.

In one embodiment, the measured parameter(s) obtained at wafer probe or final test includes a parameter predictive of the SRAM cell stability and write margins, e.g. Vtn. Setting VWL essentially equal to VDDM when VDDM=Vmin, and selectively, based on the measured parameter predictive of SRAM cell margins (such as when Vtn is high), introducing a differential when VDDM>Vmin so that VWL<VDDM when VDDM>Vmin relaxes the SNM/Vtrip/Iread trade-off as a function of VDDM and will allow further scaling of SRAM cells. Vmin may be a characteristic of the device design or may be programmed as specified by the application. Alternatively, Vmin may be determined by characterization of the chip.

Figure 4:
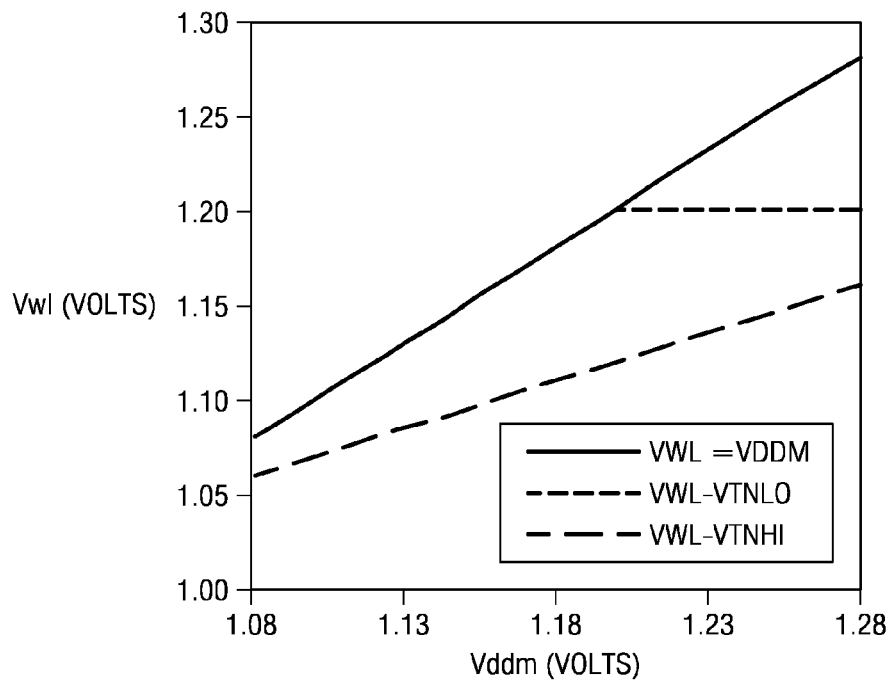
FIG. 4 shows VWL as a function of VDDM showing exemplary different "voltage trends" according to an embodiment of the invention.

In one embodiment, implementing one of the trends according to the invention as shown in FIG. 4, a distributed signal from central controller 280 would cause the local differential generating circuits 295 to each either 1) connect VWL to VDDM, or 2) introduce a differential between VWL and VDDM. Multiple binary signals can be distributed by central controller 280 for greater or finer grain control. Local level control can be from a few 10's of gates to hundreds of gates. The granularity of localization depends on device variability primarily and size of the circuitry required for the variability control.

In one embodiment, the VDDM-VWL differential that is selected will be minimal (including zero and slightly negative so the VWL>VDDM) when VDDM is at its minimum value, and will be larger (generally $\geq 0$) when VDDM is near its maximum value.

As noted above, rather than a digital signal, central controller can distribute an analog signal comprising a reference voltage to the local differential generating circuits. As noted above, the reference voltage may go to high impedance (transistor gates) inputs so as to reduce IR drops. Alternatively currents could be propagated around the SRAM die to eliminate the problems associated with local voltage drops. In this embodiment, a current can be generated at one port of the device. This current is sent around the die as required, terminating in a local current-to-voltage converter to generate the designated differential.

Figure 3A:
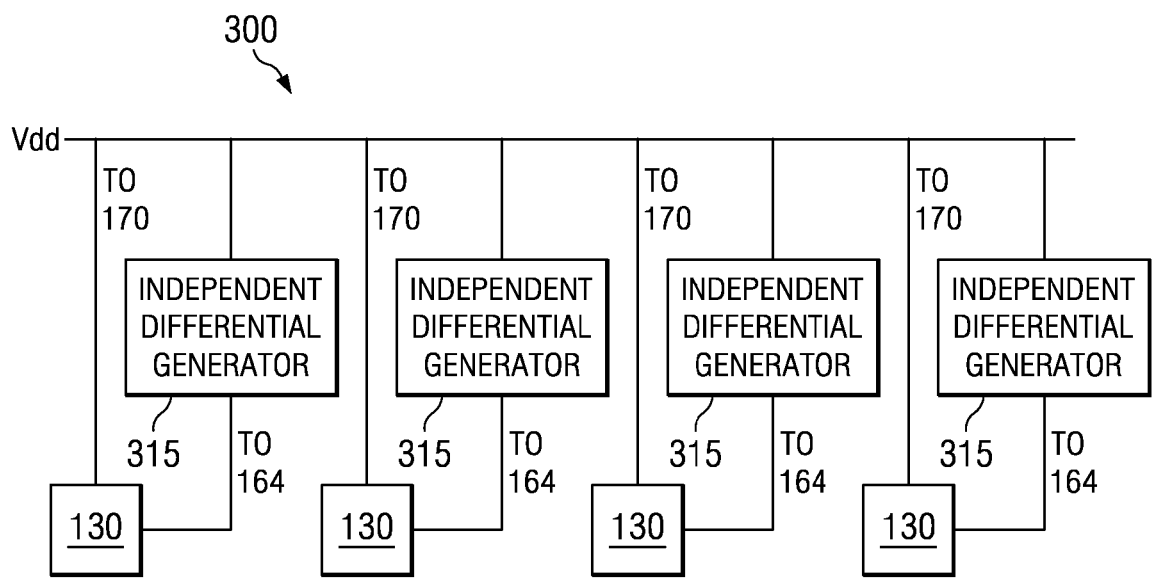
FIG. 3A shows an integrated circuit according to another embodiment of the present invention which comprises a plurality of independent local VWL/VDDM differential generating circuits operable to vary the differential across memory cells in one or more memory instance.

FIG. 3A shows an integrated circuit 300 according to another embodiment of the present invention which comprises a plurality of independent local VWL/VDDM differential generating circuits 315 operable to vary the differential across cells in one or more memory instances. One or more component strengths can be determined at each location of the differential generating circuits 315. The VDDM line is shown connected to a plurality of local WL/VDDM differential generating circuits 315 which are coupled to a plurality of memory cells (or groups of cells) shown as cell 130 as described above relative to FIG. 1D. The VDDM line is also coupled to Vdd drain power supply line 170 for cell 130. Circuit 315 may be a small-area (low cost) circuit, such as circuit 315 shown in FIG. 3A which receives VDDM as an input, and provides VWL as an output as a function of one or more process and/or environmental (e.g. temperature) dependent variables, such as NMOS strength which can be used to adjust the gain of the amplifier that defines the WL voltage. The VWL output from circuits 315 are coupled to a wordline, such as WL 164 for cell 130.

Figure 3B:
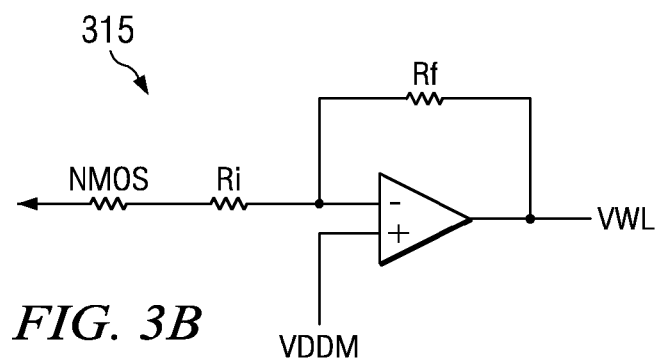
FIG. 3B shows an exemplary WL/VDDM differential generating circuit according to an embodiment of the invention.

For example, in one embodiment of the invention, as shown in FIG. 3B, circuits 315 can be implemented by placing a NMOS transistor operating in linear or saturation mode in series with an input of an amplifier having a nominal gain based on the value of an input resistor Rin in series with a nominal value of the Rdson of the NMOS transistor, and a feedback resistor Rf, will result in the gain and thus the VWL value output being lower for higher Vtn (or narrower NMOS width) as compared to lower Vtn (or wider NMOS width). Those having ordinary skill in the art will realize a wide variety of other simple analog circuit arrangements can be used to receive VDDM as an input, and provides VWL as an output as a function of one or more process and/or environmental (e.g. temperature) dependent variables, or as a function of a control signal. For example, simple voltage regulation such as provided by a diode voltage drop (such as approximated by a diode connected MOS). More complex circuitry would be needed depending on how accurately it is desired to follow a given graphical curve. When less accuracy is needed simpler circuitry will suffice. Such arrangements can include clamping circuitry, such as to provide the 1.2 volt clamp for VWL shown in FIG. 4. Depending on the requirement, the analog circuit used could be a more complex ADC/bandgap combination or include Low-Dropout Regulator (LDO) circuitry.

FIG. 4 provides simulation data according to an embodiment of the invention where the reference input is nMOS strength (Vtn or drive current)/which adjusts the VWL level as a function of the VDDM level. The VDDM level is shown between 1.08V (1.2V−10%) to 1.28V (1.2V+0.666666%). As shown in FIG. 4, there are several different "voltage trends" which relate VWL (y-axis) as a function of VDDM (x-axis); 1) VWL=VDDM, 2) VWL=VDDM except clamped above 1.2V (for vtnlo), and 3) VWL=s*VDDM where s is <1 for vtnhi. The actual trend could be more complicated than shown, comprising more trends or non-linear trends. Intermediate devices could be sufficiently different to need a separate trend. As noted above, the selection of a trend determined at test may be stored in ROM, such as a fusible ROM. As noted above, the trends shown above and other trends can be determined and generated centrally, determined centrally and generated locally, or determined and generated locally.

Figure 5:
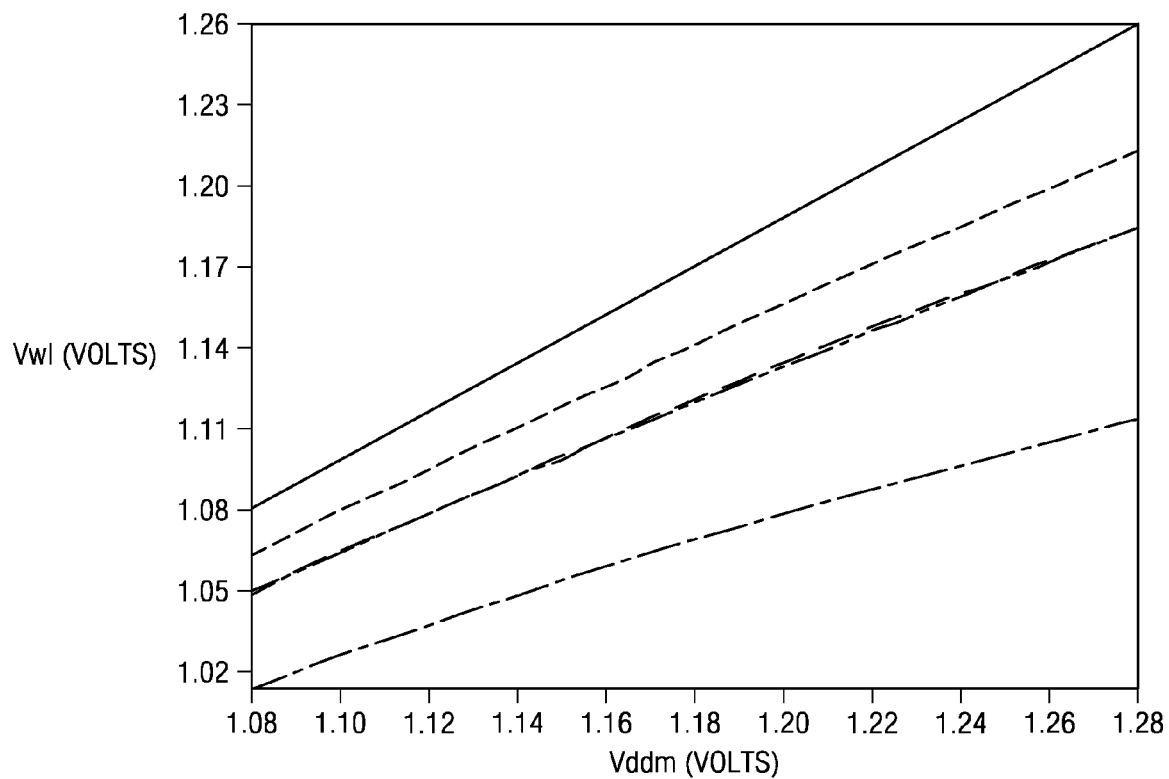
FIG. 5 shows some additional simulated voltage trends according to an embodiment of the invention. Trends are provided based on different NMOS strengths, with stronger NMOS (e.g. low vtn) receiving higher trends.

FIG. 5 shows some additional simulated voltage trends according to the invention which relate VWL (y-axis) as a function of VDDM (x-axis). Four different trends are provided based on different NMOS strengths, with stronger NMOS receiving higher trends, with VWL=VDDM being one of the trends shown.

Although an SRAM cell has generally been discussed in accordance with the arrays and method of the present invention, as described above the present invention is applicable to certain other memories, such as FeRAM and MRAM, and DRAM that may develop that use VDDM.

Moreover, it is appreciated by the inventors that cell and transistor technology variations, including array, bitline, or wordline orientation variations are contemplated in the context of the present invention.

The invention is also not limited to the use of silicon wafers, and may be implemented in association with the manufacture of various semiconductor devices, SRAM memory devices, or other memory devices, wherein the design and optimization of an SRAM cell, potential data upsets, and power consumption is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit (IC), comprising:
at least one memory array comprising a plurality of memory cells arranged in a plurality of rows and columns, said array also having a plurality of word lines for accessing rows of cells and a plurality bit lines for accessing columns of cells, and
voltage differential generating circuitry operable to provide a dynamic differential word line voltage (VWL) relative to an array supply voltage, wherein said differential is a varying function of said array supply voltage, and further wherein said VWL is coupled to said array supply voltage.

2. The IC of claim 1, wherein said differential is also a function of a process related device parameter or a temperature during operation of said IC.

3. Original) The IC of claim 2, wherein said process related device parameter is selected from Vtn, Vtp, gm, Idsat, or Idlin.

4. The IC of claim 1, where said supply voltage comprises a high supply for said array (VDDM).

5. The IC of claim 1, wherein said memory comprises an SRAM.

6. The IC of claim 1, wherein said memory comprises an FeRAM or an MRAM.

7. The IC of claim 1, further comprising trend selection storage circuitry on said IC coupled to said voltage differential generating circuitry operable to select a trend which relates said VWL as a function of said array supply voltage from a plurality of different ones of said trends.

8. The IC of claim 7, wherein said trend selection storage circuitry is programmable.

9. The IC of claim 1, further comprising trend selection circuitry coupled to said voltage differential generating circuitry.

10. The IC of claim 9, wherein said trend selection circuitry consists of a single global trend selection circuit.

11. The IC claim 9, wherein said trend selection circuitry comprises a plurality of local trend selection circuits.

12. The IC of claim 1, wherein said voltage differential generating circuitry consists of a single global voltage differential generating circuit.

13. The IC of claim 1, wherein said voltage differential generating circuitry comprises a plurality of independent local voltage differential generating circuits.

14. The IC of claim 13, wherein said plurality of local voltage differential circuits include a MOS strength or a parameter related thereto as an input.

15. The IC of claim 14, wherein said plurality of local voltage differential generating circuits include a differential input amplifier, wherein a gain of said amplifier is determined by said MOS strength parameter or said parameter related thereto.

16. The IC of claim 4, wherein said voltage differential generating circuitry is operable to set VWL=VDDM for VDDM less than a voltage level and VWL<VDDM for VDDM above said voltage level.

17. The IC of claim 16, wherein said VWL is clamped at a level above said voltage level.

18. An integrated circuit (IC), comprising:
  at least one memory array comprising a plurality of SRAM memory cells arranged in a plurality of rows and columns, said array also having a plurality of word lines for accessing rows of cells and a plurality bit lines for accessing columns of cells;
  said memory cells each including first and second cross-coupled inverters comprising PMOS loads and NMOS pull up devices, said first inverter having a first latch node and said second inverter having a second latch node; and one or more NMOS pass transistor coupled to said first latch node and to said second latch node, one of said word lines being connected to a gate of said pass transistor and one of said bit lines being connected to a source or drain of said pass transistor;
  a low supply voltage for said array (VSSM) coupled to a low voltage supply terminal of said cross-coupled inverters, and a high voltage supply for said array (VDDM) coupled to a high voltage supply terminal of said cross-coupled inverters;
  at least one voltage differential determining circuit operable for dynamically controlling a voltage differential between said VDDM and a word line voltage (VWL) coupled to said plurality of word lines, wherein said voltage differential is based on said VDDM and at least one process related parameter associated with said array, and further wherein said VDDM is coupled to said VWL.

19. The IC of claim 18, wherein said at least one voltage differential determining circuit comprises plurality of voltage differential determining circuits.

20. A method of operating a integrated circuit comprising at least one memory array, said memory array comprising a plurality of memory cells arranged in a plurality of rows and columns, said array also having a plurality of word lines for accessing rows of cells and a plurality bit lines for accessing columns of cells, the method comprising the step of:
  automatically setting a dynamic voltage differential between a supply voltage for said array and a word line voltage (VWL) coupled to said plurality of word lines based on at least said supply voltage, wherein said VWL is also coupled to said supply voltage for said array.

21. The method of claim 20, further comprising the step of selecting a trend from of a plurality trends which relate said VWL as a function of said array supply voltage, wherein said VWL is based on said trend and said supply voltage.

22. The method of claim 21, wherein said selecting consists of a single global selection for said IC.

23. The method of claim 20, wherein said setting step comprises dynamically setting, wherein said voltage differential is automatically updated during operation of said IC.

24. The method of claim 20, wherein said voltage differential comprises VWL=VDDM for VDDM less than a voltage level and VWL<VDDM for VDDM greater than said voltage level, wherein said VDDM comprises a high voltage supply for said array.

25. The method of claim 20, wherein said voltage differential comprises VWL>VDDM for VDDM less than a voltage level and VWL<VDDM for VDDM greater than the voltage level, wherein said VDDM comprises a high voltage supply for said array.

* * * * *